United States Patent
Chen et al.

(10) Patent No.: US 10,037,953 B2
(45) Date of Patent: *Jul. 31, 2018

(54) CONTACT PAD FOR SEMICONDUCTOR DEVICES

(71) Applicant: Taiwan Semiconductor Manufacturing Company, Ltd., Hsinchu (TW)

(72) Inventors: Jie Chen, New Taipei (TW); Hsien-Wei Chen, Hsinchu (TW); Ying-Ju Chen, Tuku Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/449,727

(22) Filed: Mar. 3, 2017

(65) Prior Publication Data

US 2017/0179051 A1  Jun. 22, 2017

Related U.S. Application Data

(63) Continuation of application No. 14/946,517, filed on Nov. 19, 2015, now Pat. No. 9,589,891, which is a
(Continued)

(51) Int. Cl.
*H01L 23/48* (2006.01)
*H01L 23/52* (2006.01)
(Continued)

(52) U.S. Cl.
CPC .............. *H01L 24/02* (2013.01); *H01L 24/05* (2013.01); *H01L 24/13* (2013.01);
(Continued)

(58) Field of Classification Search
USPC ......... 257/41, 81, 82, 91, 99, 177–182, 276, 257/457, 502, 459, 503, 573, 584, 602, (Continued)

(56) References Cited

U.S. PATENT DOCUMENTS 6,392,163 B1  5/2002  Rinne et al.
6,777,815 B2  8/2004  Huang
(Continued)

FOREIGN PATENT DOCUMENTS

GB  2464549  4/2010
JP  2012023065  2/2012
(Continued)

*Primary Examiner* — Tram H Nguyen
(74) *Attorney, Agent, or Firm* — Slater Matsil, LLP

(57) ABSTRACT

Packaging devices and methods of manufacture thereof for semiconductor devices are disclosed. In some embodiments, a packaging device includes a contact pad disposed over a substrate, and a passivation layer and/or polymer layer disposed over the substrate and a portion of the contact pad. A post passivation interconnect (PPI) line is disposed over the passivation layer and is coupled to an exposed portion of the contact pad. A PPI pad is disposed over the passivation layer. A transition element is disposed over the passivation layer and is coupled between the PPI line and the PPI pad. The transition element includes line having a width greater than the PPI line.

20 Claims, 5 Drawing Sheets

Related U.S. Application Data continuation of application No. 14/039,959, filed on Sep. 27, 2013, now Pat. No. 9,196,529.

(51) Int. Cl.
*H01L 29/40* (2006.01)
*H01L 23/00* (2006.01)

(52) U.S. Cl.
CPC ........... *H01L 2224/0235* (2013.01); *H01L 2224/0239* (2013.01); *H01L 2224/02311* (2013.01); *H01L 2224/02331* (2013.01); *H01L 2224/0401* (2013.01); *H01L 2224/05008* (2013.01); *H01L 2224/13024* (2013.01); *H01L 2924/01028* (2013.01); *H01L 2924/01029* (2013.01); *H01L 2924/01046* (2013.01); *H01L 2924/01079* (2013.01); *H01L 2924/3512* (2013.01)

(58) Field of Classification Search
USPC ........ 257/621, 664–677, 688–700, 734–786, 257/E23.01–E23.079; 438/613, 108, 109, 438/396, 51, 83, 98, 100, 101, 111, 112, 438/123, 124, 411, 412, 461, 584
See application file for complete search history.

(56) References Cited

U.S. PATENT DOCUMENTS

| | | | |
|---|---|---|---|
| 8,735,273 B2 | 5/2014 | Lu et al. | |
| 9,196,529 B2* | 11/2015 | Chen | H01L 21/76895 |
| 9,589,891 B2* | 3/2017 | Chen | H01L 21/76895 |
| 2004/0053483 A1* | 3/2004 | Nair | H01L 21/2885 |
| | | | 438/540 |
| 2006/0138675 A1* | 6/2006 | Rinne | H01L 24/11 |
| | | | 257/779 |
| 2007/0284726 A1 | 12/2007 | Lin et al. | |
| 2008/0128905 A1 | 6/2008 | Lee et al. | |
| 2009/0079094 A1 | 3/2009 | Lin | |
| 2011/0198753 A1 | 8/2011 | Holland | |
| 2011/0272819 A1 | 11/2011 | Park et al. | |
| 2012/0306070 A1* | 12/2012 | Yew | H01L 24/05 |
| | | | 257/737 |
| 2013/0009307 A1* | 1/2013 | Lu | H01L 24/13 |
| | | | 257/738 |
| 2013/0043583 A1 | 2/2013 | Wu et al. | |
| 2014/0061898 A1* | 3/2014 | Chen | H01L 23/3185 |
| | | | 257/737 |
| 2014/0252601 A1* | 9/2014 | Lu | H01L 21/76885 |
| | | | 257/737 |
| 2014/0252610 A1* | 9/2014 | Chen | H01L 23/562 |
| | | | 257/738 |
| 2014/0252611 A1* | 9/2014 | Chen | H01L 23/49816 |
| | | | 257/738 |
| 2014/0262468 A1 | 9/2014 | Chen et al. | |
| 2014/0264837 A1* | 9/2014 | Chen | H01L 24/11 |
| | | | 257/737 |
| 2014/0264846 A1* | 9/2014 | Chen | H01L 21/76885 |
| | | | 257/737 |
| 2014/0264884 A1 | 9/2014 | Chen et al. | |
| 2014/0374899 A1* | 12/2014 | Yang | H01L 23/49811 |
| | | | 257/737 |
| 2015/0014846 A1* | 1/2015 | Lai | H01L 24/13 |
| | | | 257/737 |
| 2015/0021758 A1* | 1/2015 | Tsai | H01L 24/13 |
| | | | 257/737 |
| 2015/0091191 A1 | 4/2015 | Chen | |
| 2017/0154794 A1* | 6/2017 | Chen | H01L 21/568 |

FOREIGN PATENT DOCUMENTS

| | | |
|---|---|---|
| KR | 1020090031293 | 3/2009 |
| KR | 1020110123526 | 11/2011 |
| KR | 1020130020512 | 2/2013 |
| TW | 479344 B | 3/2002 |
| TW | 498530 B | 8/2002 |
| TW | 200527625 A | 8/2005 |
| TW | I249822 B | 2/2006 |

* cited by examiner

CONTACT PAD FOR SEMICONDUCTOR DEVICES

This application is a continuation application of U.S. patent application Ser. No. 14/946,517, filed Nov. 19, 2015, entitled "Contact Pad for Semiconductor Devices," which is a continuation application of U.S. patent application Ser. No. 14/039,959, now U.S. Pat. No. 9,196,529, filed Sep. 27, 2013, and entitled "Contact Pad for Semiconductor Devices," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post passivation interconnect (PPI) that is used to fan-out wiring for contact pads of the package, so that electrical contacts can be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

Figure 1:
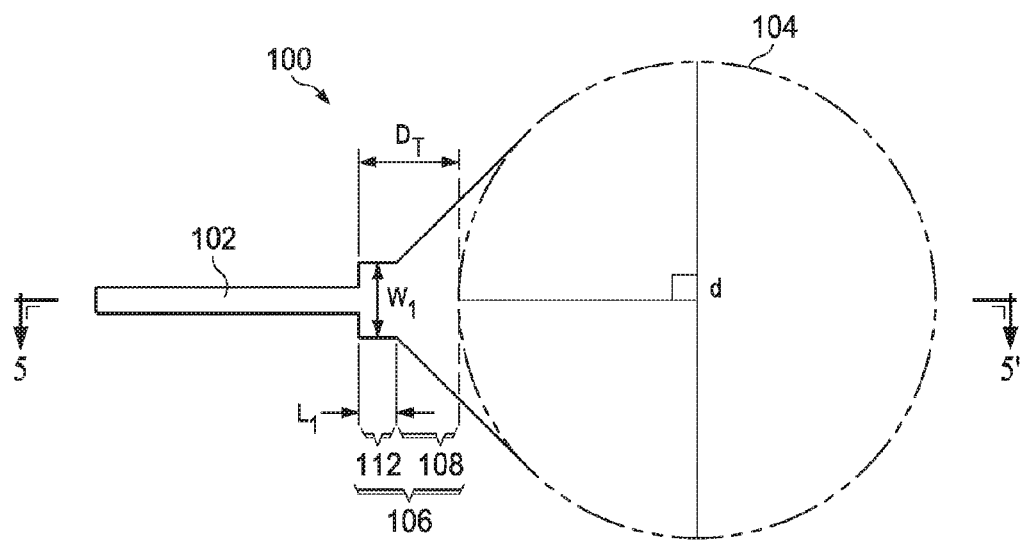
FIG. 1 is a plan view of a post-passivation interconnect line and pad in accordance with an embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Some embodiments of the present disclosure are related to packaging devices and methods of manufacture thereof for semiconductor devices. Novel packaging devices will be described herein that include a novel transition region disposed between a post-passivation interconnect (PPI) line and a PPI pad that provides an area for a wetting region to form when a conductive material is coupled to the PPI pad or when the conductive material is re-flowed in a later packaging or manufacturing process, which improves reliability and prevents cracking of the conductive material joint. As will be discussed below, embodiments are disclosed that utilize a pad structure for the purpose of attaching one substrate to another substrate, wherein each substrate may be a die, wafer, printed circuit board, packaging substrate, or the like, thereby allowing for die-to-die, wafer-to-die, wafer-to-wafer, die or wafer to printed circuit board or packaging substrate, or the like. Throughout the various views and illustrative embodiments, like reference numerals are used to designate like elements.

Figure 2:
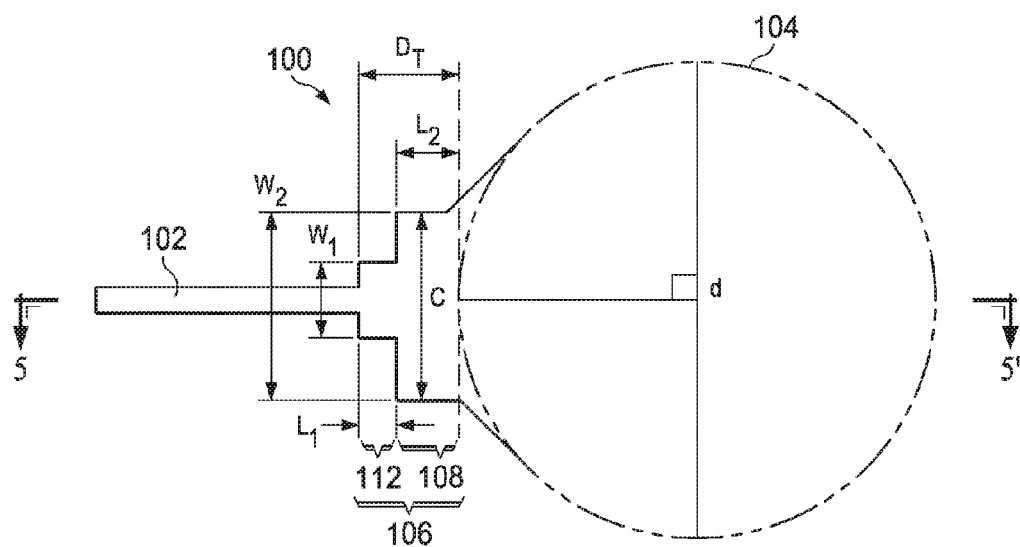
FIG. 2 is a plan view of a post-passivation interconnect line and pad in accordance with another embodiment.

FIGS. 1 and 2 are plan views of a portion of a packaging device 100 having external contacts in accordance with various embodiments. A cross-sectional view of FIGS. 1 and 2, taken along the 5-5' line, is shown and discussed below with reference to FIG. 5. Referring first to FIG. 1, the packaging device 100 includes a transition element 106 interposed between a PPI line 102 and a PPI pad 104. The PPI line 102, PPI pad 110, and transition element 106 comprise a conductive material and are integral to one another in some embodiments. Only one PPI line 102, PPI pad 104, and transition element 106 are shown in the drawings; however, a plurality of PPI lines 102, PPI pads 104, and transition elements 106 are formed across a surface of the packaging device 100 and are used for making external electrical connections as discussed in greater detail below with reference to FIG. 5. The PPI line 102, PPI pad 104, and transition element 106 comprise a redistribution layer (RDL) or other interconnect routing structures of the packaging device 100 in some embodiments, for example.

Generally, the PPI line 102 provides an electrical connection from a contact (not shown, see FIGS. 5-8) to the PPI pad 104. The PPI pad 104 is an enlarged region designed to accommodate an external electrical connection, such as a solder ball. The PPI pad 104 illustrated in FIG. 1 is circular, though other shapes may be used. The transition element 106 is designed to reduce or prevent the material of an external electrical connection from wetting onto the PPI line 102. It has been found that the wetting of an external electrical connection such as solder along the PPI line 102 creates a region of high stress that is more likely to fail due to cracking. Embodiments such as those disclosed herein provide a larger transition region between the PPI line 102 and the PPI pad 104, which reduces or prevents material such as solder wetting onto the PPI line 102 and thus reducing the stress.

The transition element 106 illustrated in FIG. 1 has a tapered region 108 extending from the PPI pad 104 and a stepped region 112 disposed between a PPI line 102 and the tapered region 108. The tapered region 108 is generally a triangular shape having a curved side proximate the PPI pad 104 in the embodiment shown in FIG. 1. A transition distance $D_T$ is a distance between the PPI line 102 and the PPI pad 104, and in an embodiment in which the PPI pad 104 has a diameter d, the transition distance $D_T$ is greater than about ⅕ of the diameter d of the PPI pad 104. In an embodiment, the transition distance $D_T$ is greater than or equal about 40 μm. The width of the transition element 106 is slightly greater than transition distance $D_T$ due to the curved shape of the PPI pad 104 in some embodiments.

The stepped region 112 of the transition element 106 comprises a region in which the width of the PPI line 102 is enlarged to form one or more steps at the junction of the PPI line 102 and the tapered region 108. In the embodiment illustrated in FIG. 1, the stepped region 112 comprises a single step having a width $W_1$ and a length $L_1$. In an embodiment such as that illustrated in FIG. 1, the width $W_1$ is between ⅕ of the diameter d of the PPI pad 104 and the diameter d of the PPI lad 104, and the length $L_1$ is less than $D_T$. In an embodiment, the width $W_1$ and the length $L_1$ is greater than or equal about 40 μm.

Other embodiments may utilize other dimensions. The dimensions such as those provided herein provide a transition area that restricts the wetting area of the electrical connection such as solder to the PPI pad 104 and the transition element 106, keeping the wetting area from reaching to the PPI line 102. In an embodiment, the flux area, flux quantity, and the dimensions of the pad and the solder ball are adjusted such that the wetting area terminates prior to the PPI line 102.

FIG. 2 illustrates another embodiment, wherein like reference numerals refer to like elements, except that the stepped region 112 of the transition element 106 comprises multiple steps, with two steps being illustrated in FIG. 2 where the width to the PPI line 102 has been increased twice as the PPI line 102 transitions to the PPI pad 104. In an embodiment, the transition distance $D_T$, the distance between the PPI line 102 and the PPI pad 104, is greater than about ⅕ of the diameter d of the PPI pad 104. In an embodiment, the transition distance $D_T$ is greater than or equal about 40 μm. The width of the transition element 106 is slightly greater than transition distance $D_T$ due to the curved shape of the PPI pad 104 in some embodiments.

In an embodiment such as that illustrated in FIG. 2, a width $W_1$ of a first step is greater than or equal to ⅕ of the diameter d of the PPI pad 104 and less than or equal to ⅖ of the diameter d of the PPI pad 104, and the length $L_1$ of the first step is greater than zero and less than the transition distance $D_T$. In an embodiment such as that illustrated in FIG. 2, a width $W_2$ of a second step is greater than the width $W_1$ of the first step, and the length $L_2$ of the second step is greater than ⅕ of the diameter d of the PPI pad 104. In an embodiment, a sum of the length L1 and L2 is greater than or equal to 40 μm.

As illustrated in FIGS. 1 and 2, the size and shape may be adjusted for a particular design. For example, the embodiment illustrated in FIG. 2 has a larger transition area and may reduce a larger amount of stress, and the embodiment illustrated in FIG. 1 has a smaller transition area that may provide a higher design flexibility where the amount of stress is less.

Other embodiments, however, may utilize other dimensions for a particular design and application. For example, the particular dimensions provided herein as examples may be modified for particular sizes, materials, applications, environments, and/or the like. As such, the dimensions provided above may be adjusted for a particular design, such as a size/volume of solder ball, size of PPI line, size of PPI pad, and/or the like.

Figure 3:
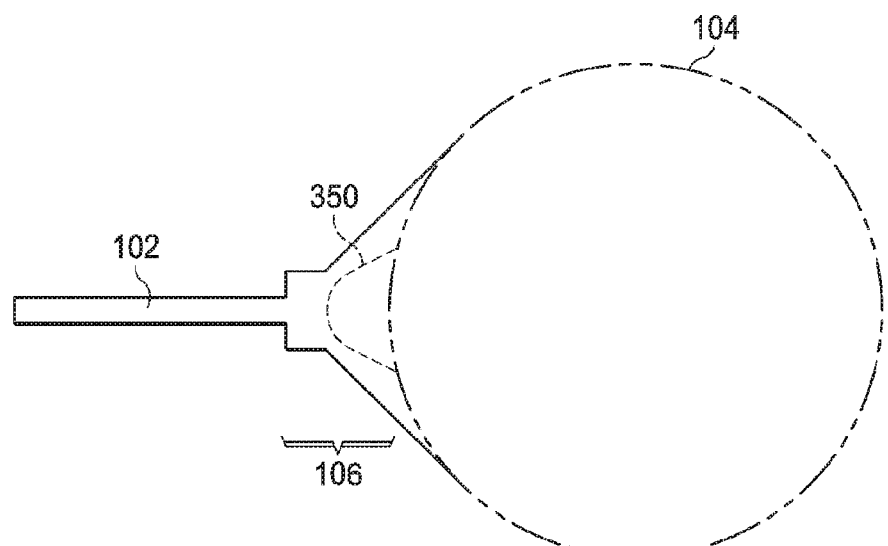
FIG. 3 illustrates a wetting region of a post-passivation interconnect line and pad in accordance with an embodiment.

FIG. 3 illustrates an example of wetting that may be used in reference to the embodiment illustrated in FIG. 1. As discussed above, the transition element 106 reduces or prevents the subsequent wetting of a conductive material such as solder onto the PPI line 102. As illustrated in FIG. 3, a wetting region 350 of connection material (e.g., the solder material) extends from the PPI pad 102 into the transition element 106 toward the stepped region 112. The stepped region 112 provides a region wider than the PPI line, thereby reducing the amount of stress.

Figure 4:
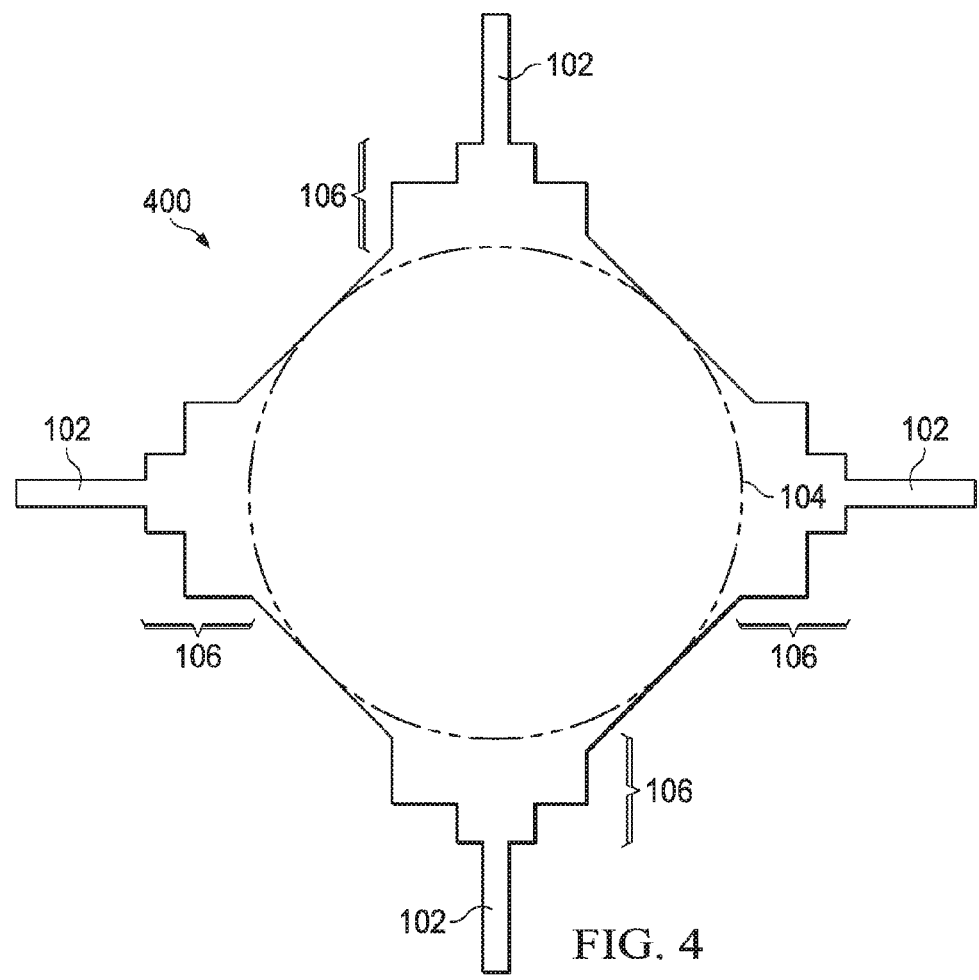
FIG. 4 is a plan view of a post-passivation interconnect line and pad in accordance with yet another embodiment.

FIG. 4 illustrates a packaging device 400 having connections to multiple PPI lines 102 in accordance with an embodiment. The embodiments illustrated in FIGS. 1-3 have a PPI pad 104 connected to a single PPI line 102. The embodiment shown in FIG. 4 illustrates that in other embodiments the PPI pad 104 may have connections to a plurality of PPI lines 102, with four PPI lines 104 being connected to the single PPI pad 104 in FIG. 4. Other embodiments may be connected with fewer or more PPI lines.

In an embodiment, each of the PPI lines 102 exhibits a transition element 106 at the connection to the PPI pad 104 as shown in FIG. 4. Such an arrangement reduces the stress on the PPI line 102 due to wetting. FIG. 4 illustrates an embodiment in which multiple steps, two steps in this case, is used in each of the transition elements for illustrative purposes only. In other embodiments, the transition element may be omitted on one or more of the PPI lines, and/or one or more of the stepped regions of the transition elements may have fewer or more steps.

Figure 5:
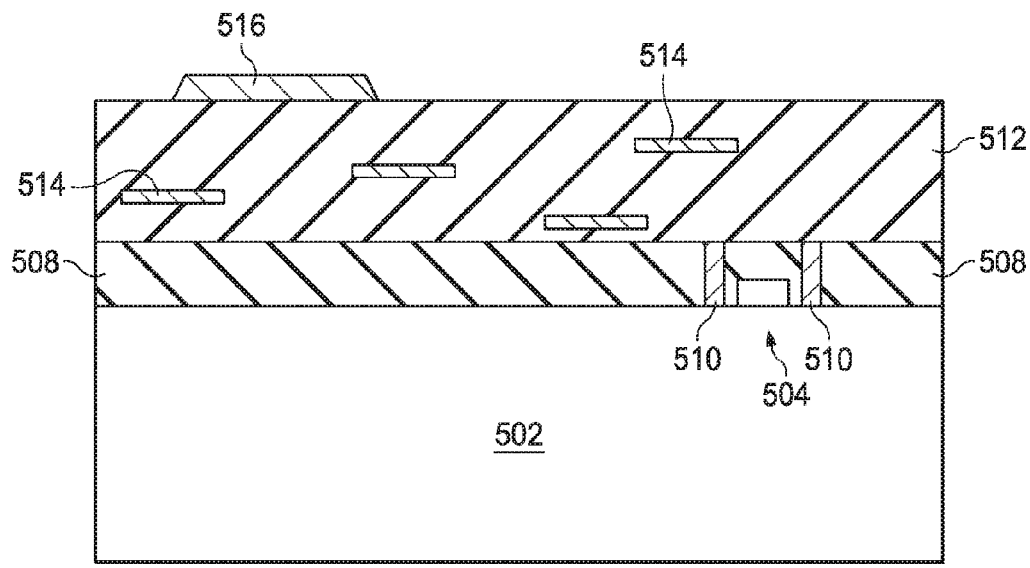
FIGS. 5-8 illustrate various intermediate stages of a method of forming a semiconductor device having a post-passivation interconnect line and pad in accordance with an embodiment.

FIGS. 5-8 illustrate various intermediate stages of a method of forming a semiconductor device such as that discussed above with reference to FIGS. 1-4 in accordance with an embodiment. Referring first to FIG. 5, a portion of a substrate 502 having electrical circuitry 504 formed thereon is shown in accordance with an embodiment. The substrate 502 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

Electrical circuitry 504 formed on the substrate 502 may be any type of circuitry suitable for a particular application. In an embodiment, the electrical circuitry 504 includes electrical devices formed on the substrate 502 with one or more dielectric layers overlying the electrical devices. Metal layers may be formed between dielectric layers to route electrical signals between the electrical devices. Electrical devices may also be formed in one or more dielectric layers.

For example, the electrical circuitry 504 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 5 is an inter-layer dielectric (ILD) layer 508. The ILD layer 508 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 508 may comprise a plurality of dielectric layers.

Contacts, such as contacts 510, are formed through the ILD layer 508 to provide an electrical contact to the electrical circuitry 504. The contacts 510 may be formed, for example, by using photolithography techniques to deposit and pattern a photoresist material on the ILD layer 508 to expose portions of the ILD layer 508 that are to become the contacts 510. An etch process, such as an anisotropic dry etch process, may be used to create openings in the ILD layer 508. The openings may be lined with a diffusion barrier layer and/or an adhesion layer (not shown), and filled with a conductive material. In an embodiment, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 510 as illustrated in FIG. 5.

One or more inter-metal dielectric (IMD) layers 512 and the associated metallization layers 514 are formed over the ILD layer 508. Generally, the one or more IMD layers 512 and the associated metallization layers are used to interconnect the electrical circuitry 504 to each other and to provide an external electrical connection. The IMD layers 512 may be formed of a low-K dielectric material, such as FSG formed by PECVD techniques or high-density plasma CVD (HDPCVD), or the like.

It should be noted that one or more etch stop layers (not shown) may be positioned between adjacent ones of the dielectric layers, e.g., the ILD layer 508 and the IMD layers 512. Generally, the etch stop layers provide a mechanism to stop an etching process when forming vias and/or contacts. The etch stop layers are formed of a dielectric material having a different etch selectivity from adjacent layers, e.g., the underlying semiconductor substrate 502, the overlying ILD layer 508, and the overlying IMD layers 512. In an embodiment, etch stop layers may be formed of SiN, SiCN, SiCO, CN, combinations thereof, or the like, deposited by CVD or PECVD techniques.

A contact 516 is provided in the uppermost IMD layer to provide external electrical connections to the electrical circuitry 504. In an embodiment, the contact is an aluminum pad or an aluminum-copper pad, although other metallic materials may be used.

Figure 6:
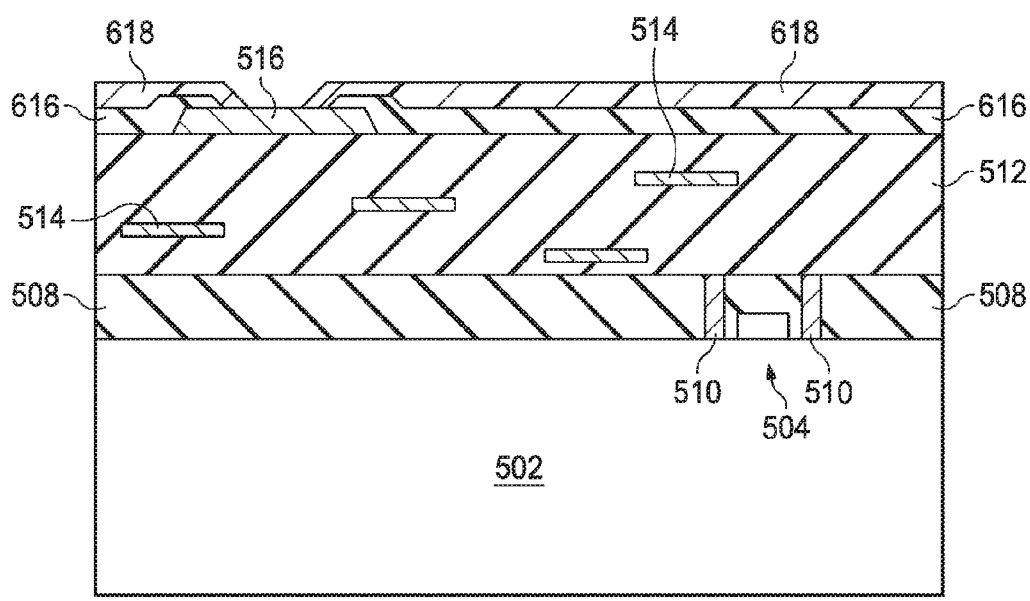

FIG. 6 illustrates passivation layer 616 formed over the IMD layers 512 and may be formed of a dielectric material, such as SiN, a plasma-enhance oxide (PEOX), a plasma-enhanced SiN (PE-SiN), plasma-enhanced undoped silicate glass (PE-USG), or the like. As illustrated in FIG. 6, the passivation layer 616 is formed such that at least a portion of the contact 516 is exposed. The passivation layer 616 may be formed by a blanket deposition and patterned using photolithography process to provide an opening over the contact 516 and to protect the underlying layers from various environmental contaminants.

FIG. 6 further illustrates a polymer layer 618 formed over passivation layer 616. Polymer layer 618 may be formed of a polymer such as an epoxy, polyimide, benzocyclobutene (BCB), polybenzoxazole (PBO), and the like. The formation methods may include spin coating, for example. The polymer layer 618 is patterned to form an opening, through which the contact 516 is exposed. The patterning of polymer layer 618 may include photolithography techniques. A curing step may be performed to cure the polymer layer 618.

Figure 7:
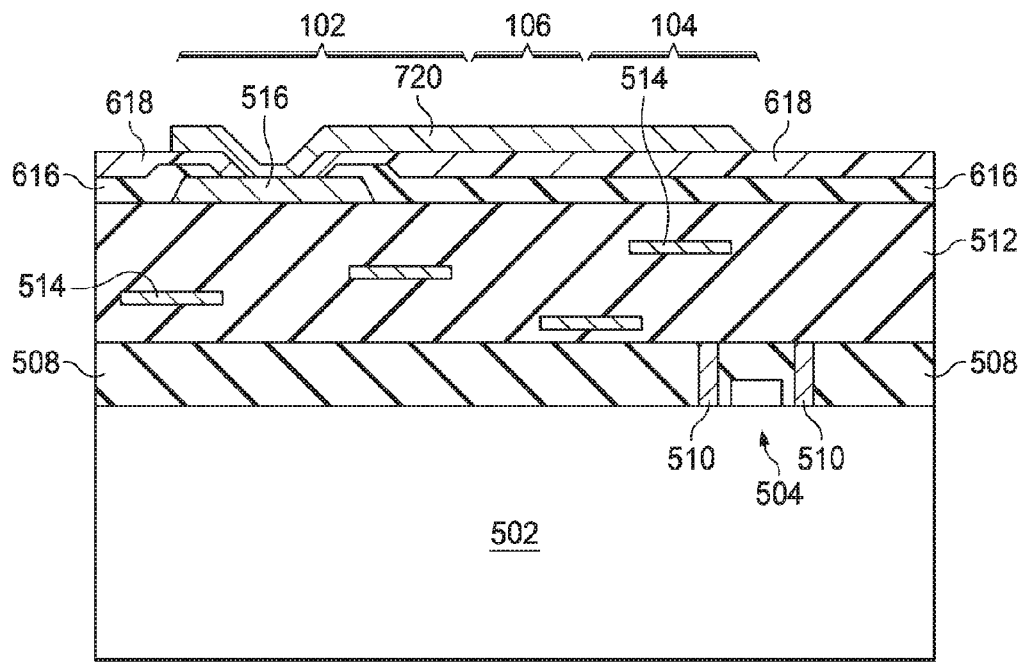

FIG. 7 illustrates a PPI 720 formed and patterned over the polymer layer 618 and fills an opening in a polymer layer 618 and a passivation layer 616, thereby forming an electrical connection with the contact 516. The PPI 720 provides an electrical connection upon which an electrical connector, e.g., a solder ball/bump, may be placed. In an embodiment, the PPI 720 is formed of copper or copper alloy. In other embodiments, the PPI 720 may be a multi-layered structure, such as a copper layer coated with electro-less nickel electro-less palladium immersion gold (ENEPIG), which includes a nickel layer, a palladium layer on the nickel layer, and a gold layer on the palladium layer. The gold layer may be formed using immersion plating. In other embodiments, other conductive materials may be used to form the PPI 720.

The PPI 720 includes the PPI line 102, the PPI pad 104, and the transition element interposed between the PPI line 102 and the PPI pad 104. (See FIGS. 1-4 for example plan views. The PPI line 102 may have a narrow, wide, or tapered shape. The PPI line 102 may comprise a substantially constant thickness and width. The PPI line 102 terminates at the transition element 106, and the transition element 106 terminates at the PPI pad 104; therefore, the bodies of the PPI line 102, transition element 106, and the PPI pad 104 may be formed as one piece.

Figure 8:
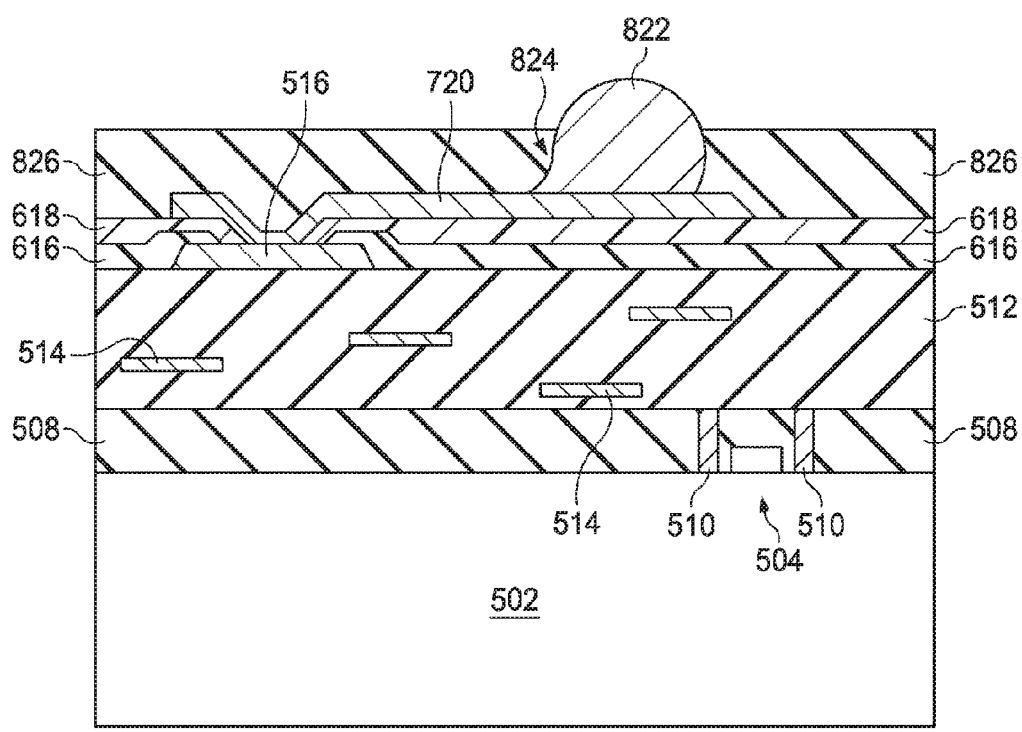

Referring next to FIG. 8, a conductive material 822 is formed over the PPI pad 104. The PPI pad 104 is used to connect to the conductive material 822, forming a connection between the contact 514 to the conductive material 822 by way of the PPI line 102, the transition element 106, and the PPI pad 104. The conductive material 822 may have a larger diameter or smaller diameter than the diameter d of the PPI pad 104. (See, e.g., FIGS. 1-4.)

In an embodiment, the conductive material 822 comprises a eutectic material and may comprise a solder bump or a solder ball, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials 120 such as solder balls may be formed from SnCu compounds as well, without the use of silver (Ag). Alternatively, lead-free solder connectors may include tin and silver, Sn—Ag, without the use of copper. The conductive material 120 may be one among an array of the conductive materials 822 formed as a grid, referred to as a "ball grid array" or "BGA". The conductive materials 822 may alternatively be arranged in other shapes. The conductive material 822 comprises a conductive ball having a shape of a partial sphere in some embodiments. Alternatively, the conductive material 822 may comprise other shapes. The conductive material 822 may also comprise non-spherical conductive connectors, for example.

The conductive material 822 is attached in some embodiments using a solder ball drop process. During the conductive material 822 mounting process, or after the conductive material mounting process, the eutectic material of the conductive material 822 may be re-flowed, and a portion of the conductive material 822 flows over a portion of the transition element 106 in some embodiments, forming a wetting region 824 extending away from the PPI pad 104 within the transition element 106. In some embodiments, the wetting region 824 is formed over the entire transition element 106. In other embodiments, the wetting region 824 is not formed. Advantageously, the inclusion of the transition element 106 having the stepped region 112 and the tapered region 108, and the dimensions and shape of the transition element 106 result in preventing or reducing an amount of wetting region formation over the PPI line 102. In some embodiments, the wetting region 824 is not formed on the PPI line 102, for example.

A liquid molding compound (LMC) 826 is then formed over the PPI line 102, PPI pad 104, and transition element 106 and exposed portions of the polymer layer 618 in some embodiments. A top portion of the LMC 826 may be recessed so that a top portion of the conductive material 822 is exposed. Alternatively, an amount of the molding compound 826 is controlled so that the top portion of the conductive material 822 is exposed. A molding compound clamp may be applied during a curing process and a plasma treatment process of the molding compound 826 in some embodiments, for example.

The process discussed above describes a two-mask process, in which two masks are used to form the interconnect. In this case, a first mask is used to form an opening to expose a portion of the contact pad through the passivation and/or polymer layers, and a second mask is used to form the PPI line and pad. A three-mask process utilizes another passivation and/or polymer layer over the PPI line and pad, which layer is patterned to form an opening to the PPI pad, and a four-mask process utilizes another mask to form an under-bump metallization layer.

Embodiments such as those discussed herein are particularly useful in the two-mask process, but may be used in other systems such as the three-mask or four-mask systems. In the two-mask process, the PPI line and pad are exposed during wetting and as such the connection material, e.g., solder, is more likely to be able to extend to or along the PPI line, thereby increasing the stress.

Figure 9:
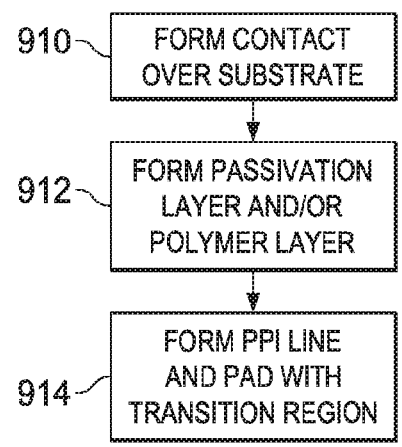
FIG. 9 is a flow chart illustrating a method of forming a semiconductor device having a post-passivation interconnect line and pad in accordance with an embodiment.

FIG. 9 is a flow chart illustrating a method of manufacturing a packaging device in accordance with some embodiments of the present disclosure. In step 910, a contact pad is formed over a substrate, such as a contact pad to one or more metallization layers formed over an integrated circuit substrate. In step 912, a passivation layer and/or a polymer layer is formed over the substrate and a portion of the contact pad such that at least a portion of the contact pad is exposed. In step 914, a PPI line is formed over the passivation layer 616 coupled to the exposed portion of the contact pad, such that the PPI line exhibits a transition region such as that discussed above with reference to FIGS. 1-4. Thereafter, other back-end-of-line and packaging processes may be performed, such as bumping, bonding, and the like.

In an embodiment, a semiconductor structure is provided. The semiconductor structure includes a substrate having a contact pad formed thereon. A passivation layer is positioned over the substrate such that at least a portion of the contact pad is exposed, and a PPI is positioned over the passivation layer and exposed portions of the contact pad. The PPI is electrically coupled to the contact pad. The PPI includes a PPI line, a PPI pad, and a transition element interposed between the PPI line and the PPI pad, wherein the transition element has a stepped region with a width greater than a width of the PPI line.

In another embodiment, a semiconductor structure is provided. The semiconductor structure includes a substrate having a conductive pad and one or more conductive lines formed thereon. Conductive transition elements are interposed between the conductive pad and each of the one or more conductive lines, wherein the transition elements include a stepped region having one or more steps. Each of the one or more steps includes a conductive line wider than respective ones of the one or more conductive lines.

In yet another embodiment, a method of forming a semiconductor device is provided. The method includes providing a substrate having a contact pad thereon and forming one or more dielectric layers over the substrate such that at least a portion of the contact pad is exposed. A PPI is formed over the passivation layer and the exposed portion of the contact pad. The PPI includes a PPI pad, a PPI line extending from the contact pad toward the PPI pad, and a stepped region interposed between the PPI line and the PPI pad, wherein the stepped region includes one or more steps having a greater width than the PPI line.

In yet still another embodiment, a semiconductor structure is provided. The semiconductor structure includes a substrate having a contact pad thereon and an insulating layer over the substrate, wherein a portion of the contact pad is exposed. A conductive interconnect is electrically coupled between the contact pad and an external connection, the conductive interconnect having a first line portion, a pad portion, and a second line portion interposed between the first line portion and the pad portion, a width of the second line portion being greater than a width of the first line portion, the second line portion having substantially parallel sidewalls.

In yet still another embodiment, a method is provided. The method includes forming a contact pad on a substrate, and forming one or more insulating layers over the substrate, wherein an exposed portion of the contact pad is exposed. A conductive interconnect is formed over the one or more insulating layers and the exposed portion of the contact pad, the conductive interconnect having a first line portion, a rounded pad, and one or more intervening line portions between the rounded pad and the first line portion, each of the one or more intervening line portions having a width wider and a previous line portion.

In yet still another embodiment, a method is provided. The method includes forming a contact pad on a substrate, and forming one or more insulating layers over the substrate, wherein an exposed portion of the contact pad is exposed. A conductive interconnect is formed over the one or more insulating layers and the exposed portion of the contact pad, the conductive interconnect having a first line portion, a pad portion, and a first transition portion interposed between the first line portion and the pad portion, the first transition portion having one or more first linear segments, each of the one or more first linear segments having substantially parallel sidewalls, a width of each of the one or more first linear segments having a width greater than a width of the first line portion.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor structure comprising:
    a substrate having a contact pad thereon;
    an insulating layer over the substrate, wherein a portion of the contact pad is exposed; and
    a conductive interconnect electrically coupled between the contact pad and an external connection, the conductive interconnect having a first line portion, a pad portion, a tapered section extending from the pad portion, and an intermediate portion interposed between the first line portion and the tapered section, a sidewall of the intermediate portion having a slope relative to a sidewall of the first line portion different than sidewalls of the tapered section in a plan view.

2. The semiconductor structure of claim 1, wherein sidewalls of the first line portion are parallel.

3. The semiconductor structure of claim 2, wherein sidewalls of the intermediate portion are parallel.

4. The semiconductor structure of claim 1, further comprising one or more additional intermediate portions interposed between the first line portion and the tapered section, the intermediate portion and each of the additional intermediate portions having different widths.

5. The semiconductor structure of claim 4, wherein the slope of the sidewalls of the intermediate portion and a slope of sidewalls of the one or more additional intermediate portions relative to the sidewall of the first line portion are a same slope in the plan view.

6. The semiconductor structure of claim 1, further comprising one or more additional line portions extending from the pad portion.

7. The semiconductor structure of claim 1, further comprising a conductive material disposed on the pad portion, the conductive material extending over the tapered section.

8. A method of forming a semiconductor device, the method comprising:
    forming a contact pad on a substrate;
    forming one or more insulating layers over the substrate, wherein an exposed portion of the contact pad is exposed; and
    forming a conductive interconnect over the one or more insulating layers and the exposed portion of the contact pad, the conductive interconnect having a first line portion, a rounded pad, a tapered section adjacent the rounded pad, and one or more intervening line portions between the tapered section and the first line portion, each of the one or more intervening line portions having a width wider than a previous line portion.

9. The method of claim 8, wherein a sidewall of the tapered section has a first slope relative to a sidewall of the first line portion in a plan view, the first slope being different than a slope of each sidewall of the one or more intervening line portions relative to the sidewall of the first line portion in the plan view.

10. The method of claim 8, further comprising:
    forming a conductive material on the rounded pad; and
    forming a molding compound over the one or more insulating layers and along sidewalls of the conductive material, the conductive material protruding through the molding compound.

11. The method of claim 8, wherein the one or more intervening line portions comprises a plurality of intervening line portions.

12. The method of claim 8, wherein a distance between the rounded pad and the first line portion is greater than one-fifth of a diameter of the rounded pad.

13. The method of claim 8, wherein a width of a first intervening line portion closest to the first line portion is greater than or equal to one-fifth of a diameter of the rounded pad.

14. The method of claim 8, wherein each of the one or more intervening line portions have parallel sidewalls in a plan view.

15. A method of forming a semiconductor device, the method comprising:
    forming a contact pad on a substrate;
    forming one or more insulating layers over the substrate, wherein an exposed portion of the contact pad is exposed; and
    forming a conductive interconnect over the one or more insulating layers and the exposed portion of the contact pad, the conductive interconnect having a first line portion, a pad portion, and a first transition portion interposed between the first line portion and the pad portion, the first transition portion having a plurality of adjacent segments, each of the plurality of adjacent segments having a different width or a different sidewall slope than immediately adjacent ones of the plurality of adjacent segments.

16. The method of claim 15, wherein the first transition portion comprises a tapered section immediately adjacent the pad portion, and further comprising reflowing a solder onto the pad portion, the solder extending onto the tapered section, the first line portion being free of solder.

17. The method of claim 16, further comprising forming a molding compound over the one or more insulating layers, the solder protruding through the molding compound.

18. The method of claim 15, further comprising forming a second line portion and a second transition portion extending from the pad portion, the second transition portion being interposed between the second line portion and the pad portion.

19. The method of claim 18, wherein the second transition portion has a similar shape as the first transition portion.

20. The method of claim 18, further comprising one or more additional line portions and additional transition portions.

* * * * *